US010043825B2

(12) United States Patent
Balakrishnan et al.

(10) Patent No.: US 10,043,825 B2
(45) Date of Patent: Aug. 7, 2018

(54) LATERAL BIPOLAR JUNCTION TRANSISTOR WITH MULTIPLE BASE LENGTHS

(71) Applicant: International Business Machines Corporation, Armonk, NY (US)

(72) Inventors: Karthik Balakrishnan, White Plains, NY (US); Pouya Hashemi, White Plains, NY (US); Tak H. Ning, Yorktown Heights, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/596,135

(22) Filed: May 16, 2017

(65) Prior Publication Data

US 2018/0047750 A1    Feb. 15, 2018

Related U.S. Application Data

(63) Continuation of application No. 15/236,547, filed on Aug. 15, 2016, now Pat. No. 9,761,608.

(51) Int. Cl.
| | | |
|---|---|---|
| *H01L 29/735* | (2006.01) | |
| *H01L 27/12* | (2006.01) | |
| *H01L 21/84* | (2006.01) | |
| *H01L 21/3105* | (2006.01) | |

(Continued)

(52) U.S. Cl.
CPC ...... *H01L 27/1203* (2013.01); *H01L 21/2253* (2013.01); *H01L 21/3065* (2013.01);
(Continued)

(58) Field of Classification Search
CPC .................. H01L 29/6625; H01L 21/8222
See application file for complete search history.

(56) References Cited

U.S. PATENT DOCUMENTS

| 3,566,218 A | 2/1971 | Widlar et al. |
|---|---|---|
| 4,047,217 A | 9/1977 | McCaffrey et al. |

(Continued)

FOREIGN PATENT DOCUMENTS

| JP | 50-26916 B | 9/1975 |
|---|---|---|
| JP | 10189754 A | 7/1998 |

*Primary Examiner* — Victoria K Hall
(74) *Attorney, Agent, or Firm* — Harrington & Smith; Louis J. Percello

(57) ABSTRACT

A method comprises forming shallow trenches in an intrinsic base semiconductor layer and forming a first base layer thereon; applying a first mask to the layer; etching the first base layer; forming a second base layer on the intrinsic base semiconductor layer adjacent the first base layer; removing the first mask; applying a second mask to the base layers; simultaneously etching the layers to produce extrinsic bases of reduced cross dimensions, a length of the second extrinsic base layer being different from a length of the first extrinsic base layer; disposing spacers on the extrinsic bases; etching around the bases leaving the intrinsic base semiconductor layer under the bases and spacers; implanting ions into sides of the intrinsic base semiconductor layer under the extrinsic bases to form emitter/collector junctions; depositing semiconductor material adjacent to the junctions and the trenches; and removing the applied second mask.

20 Claims, 8 Drawing Sheets

(51) Int. Cl.
*H01L 21/762* (2006.01)
*H01L 21/3065* (2006.01)
*H01L 21/225* (2006.01)
*H01L 29/66* (2006.01)
*H01L 29/10* (2006.01)
*H01L 29/16* (2006.01)
*H01L 29/161* (2006.01)
*H01L 21/8222* (2006.01)

(52) U.S. Cl.
CPC .. *H01L 21/31053* (2013.01); *H01L 21/76283* (2013.01); *H01L 21/84* (2013.01); *H01L 21/8222* (2013.01); *H01L 29/1008* (2013.01); *H01L 29/16* (2013.01); *H01L 29/161* (2013.01); *H01L 29/6625* (2013.01); *H01L 29/735* (2013.01)

(56) References Cited

U.S. PATENT DOCUMENTS

| | | |
|---|---|---|
| 4,058,825 A | 11/1977 | Bonis et al. |
| 4,535,531 A | 8/1985 | Bhatia et al. |
| 6,222,249 B1 | 4/2001 | Osborne et al. |
| 6,436,780 B1 | 8/2002 | Osborne et al. |
| 6,759,303 B1 | 7/2004 | Cartagena |
| 8,212,292 B2 | 7/2012 | Lin et al. |
| 8,946,041 B2 | 2/2015 | Lin et al. |
| 2002/0105053 A1* | 8/2002 | Sato .............. H01L 21/8222 257/565 |
| 2006/0060941 A1* | 3/2006 | Sun ............... H01L 29/0821 257/557 |
| 2008/0268604 A1* | 10/2008 | Geiss ............ H01L 21/28518 438/318 |

* cited by examiner

LATERAL BIPOLAR JUNCTION TRANSISTOR WITH MULTIPLE BASE LENGTHS

CROSS REFERENCE

This patent application is a continuation application of U.S. patent application Ser. No. 15/236,547, filed on Aug. 15, 2016, now U.S. Pat. No. 9,761,608, the disclosure of which is incorporated by reference herein in its entirety.

BACKGROUND

The exemplary embodiments described herein relate generally to semiconductor devices and methods for the fabrication thereof and, more specifically, to the structures and fabrication methods of lateral bipolar junction transistors having multiple base lengths.

A bipolar junction transistor (BJT) is a semiconductor device comprising three sections of semiconductor material arranged to alternate between P-type and N-type, the sections of semiconductor material forming a base, an emitter, and a collector, thus resulting in a three-region device having an emitter region, a base region, and a collector region having two P-N junctions with one P-N junction being between the emitter and the base and the other P-N junction being between the collector and the base. Each bipolar junction transistor is thus classified as either PNP or NPN according to the arrangement of the P-type material and N-type material. An NPN BJT has an N-type emitter, a P-type base, and an N-type collector, and a PNP BJT has a P-type emitter, an N-type base, and a P-type collector. The function of a BJT is to amplify current, i.e. the collector current is larger than the base current.

In a lateral BJT, the base is located between the emitter and the collector, with the emitter/base junction and the collector/base junction being formed between laterally arranged components. The characteristics of a lateral BJT depend on the length of the base, which is determined by the spacing between the emitter and the collector regions. For digital circuits, a small base length is desirable in order to increase speed. For radio frequency (RF) and analog applications, high speed (high unity current gain frequency ($f_T$) and high unity power gain frequency ($f_{max}$)) is desirable for some applications, and large Early voltage ($V_A$) is desirable for other applications. Early voltage is derived from a relationship between collector current as a function of collector/emitter voltage and is based on the Early effect, which is the variation in the length of the base in the BJT due to a variation in the applied base-to-collector voltage. However, in the BJT there is a tradeoff between speed and Early voltage.

BRIEF SUMMARY

In one exemplary aspect, a method comprises forming shallow trench isolations in an intrinsic base semiconductor layer of a substrate, the substrate comprising the intrinsic base semiconductor layer located on a buried oxide layer, the buried oxide layer being located on a handle substrate; forming a first base layer on the intrinsic base semiconductor layer and the shallow trench isolations; applying a first mask to at least a portion of the first base layer; etching an exposed portion of the first base layer not masked; forming a second base layer on the intrinsic base semiconductor layer of the substrate adjacent to the first base layer; removing the applied first mask; applying a second mask to a portion of the first base layer and a portion of the second base layer; simultaneously etching the first base layer and the second base layer, the simultaneous etching causing the material of the second base layer to be undercut around the second mask to produce a first extrinsic base and a second extrinsic base of a reduced cross dimension as compared to the first extrinsic base; disposing sidewall spacers on each of the first extrinsic base and the second extrinsic base; etching the intrinsic base semiconductor layer away around the first extrinsic base and the second extrinsic base leaving the intrinsic base semiconductor layer under the first extrinsic base and the sidewall spacers thereof and under the second extrinsic base and the sidewall spacers thereof; implanting ions into exposed vertical sides of the intrinsic base semiconductor layer under the first extrinsic base to form a first emitter/collector junction and into exposed vertical sides of the intrinsic base semiconductor layer under the second extrinsic base to form a second emitter/collector junction; depositing a layer of semiconductor material on the substrate adjacent to the first emitter/collector junction and the second emitter/collector junction and the formed shallow trench isolations; and removing the applied second mask.

In another exemplary aspect, a method of forming a lateral bipolar junction transistor comprises using a shallow trench isolation to isolate portions of an intrinsic semiconductor base layer of a substrate from other portions of the intrinsic semiconductor base layer; forming a first base layer of silicon on the intrinsic base semiconductor layer; depositing a first hardmask on at least a portion of the first base layer; etching an exposed portion of the first base layer not covered by the first hardmask; forming a second base layer of SiGe on the intrinsic base semiconductor layer of the substrate adjacent to the first base layer; applying a first chemical mechanical polish to remove the first hardmask; patterning upper surfaces of the first base layer and the second base layer by depositing a second hardmask on a portion of the first base layer and a portion of the second base layer; simultaneously etching the first base layer around the second hardmask to produce a first extrinsic base and etching the second base layer around the second hardmask to produce a second extrinsic base; selectively etching the second base layer under the second hardmask to cause the second extrinsic base to have a reduced cross dimension as compared to the first extrinsic base; disposing sidewall spacers on each of the first extrinsic base and the second extrinsic base; etching the intrinsic base semiconductor layer to leave the intrinsic base semiconductor layer under the first extrinsic base and under the second extrinsic base; implanting ions into exposed vertical sides of the intrinsic base semiconductor layer under the first extrinsic base to form a first emitter/collector junction and into exposed vertical sides of the intrinsic base semiconductor layer under the second extrinsic base to form a second emitter/collector junction; annealing the implanted ions; epitaxially depositing a layer of semiconductor material on the substrate adjacent to the first emitter/collector junction and the second emitter/collector junction; and applying a second chemical mechanical polish to remove the second hardmask.

In another exemplary aspect, an apparatus comprises a substrate comprising a semiconductor layer of material located on a buried oxide layer, the buried oxide layer being located on a handle substrate; a first emitter/collector disposed in the semiconductor layer of material, a first intrinsic base disposed between a first emitter and a first collector, and a first extrinsic base of a first material disposed on the first intrinsic base; a second emitter/collector disposed in the semiconductor layer of material, a second intrinsic base disposed between a second emitter and a second collector, and a second extrinsic base of a second material disposed on the second intrinsic base; and a shallow trench isolation between the first emitter/collector disposed in the semiconductor layer of material and the second emitter/collector disposed in the semiconductor layer of material. A cross dimension of the first extrinsic base may be different from a cross dimension of the second extrinsic base.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

Disclosed herein are exemplary methods for the fabrication of lateral bipolar junction transistors (BJT) having multiple and different base lengths (different spacing between the emitter and the collector) on the same integrated chip (IC) in an effort to meet the needs of various semiconductor applications for which both high speeds and large Early voltages are desired.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

Figure 1:
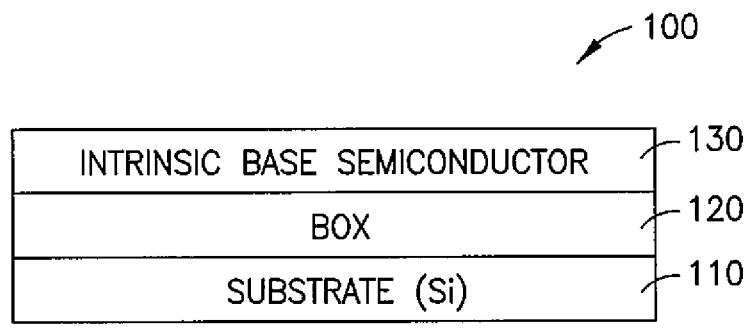
FIG. 1 is a schematic representation of one exemplary embodiment of a starting substrate on which a BJT may be formed.

Referring to FIG. 1, a starting substrate 100 on which lateral BJTs may be fabricated is provided. The substrate 100 may comprise a bulk silicon material 110 as a handle substrate having a buried oxide (BOX) layer 120 of silicon dioxide ($SiO_2$) thereon over which an intrinsic base semiconductor layer 130 is provided. The intrinsic base semiconductor layer 130 may comprise any material suitable for the support of the BJT. Exemplary materials from which the intrinsic base semiconductor layer 130 may be formed include, but are not limited to, silicon (Si), germanium (Ge), and SiGe (silicon germanium). The application of any of the foregoing exemplary materials would denote the starting substrate 100 as a silicon-on-insulator (SOI) substrate, a germanium-on-insulator (GeOI) substrate, or a SiGe-on-insulator (SGOI) substrate. Intrinsic base semiconductor layer 130 may have a doping of P-type for a lateral NPN BJT, or a doping of N-type for a lateral PNP BJT. Intrinsic base semiconductor layer 130 can be doped in situ during epitaxial growth or doped by ion implantation after epitaxial growth. Suitable N-type dopants include arsenic, phosphorus, and antimony. Suitable P-type dopants include boron, aluminum, gallium, and indium.

Figure 2:
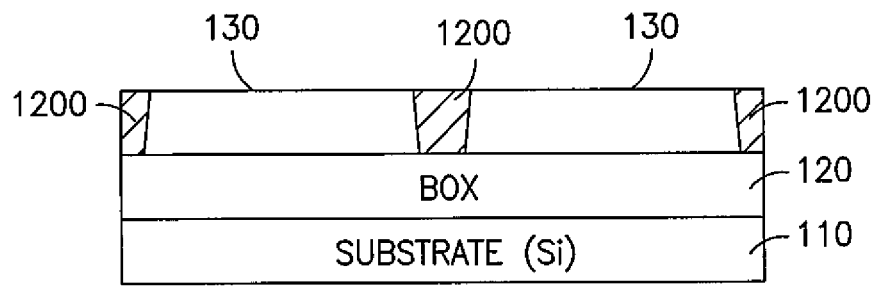
FIG. 2 is a schematic representation of the starting substrate of FIG. 1 in which a shallow trench isolation is formed in an intrinsic base semiconductor layer of the starting substrate.

Referring to FIG. 2, a shallow trench isolation (STI) process may be used to form one or more shallow trenches 1200 in the intrinsic base semiconductor layer 130 to isolate devices subsequently formed on the starting substrate 100. The shallow trenches 1200 may be formed by an etch process. Exemplary etch processes include, but are not limited to, wet etch techniques (e.g., etching using polyphosphoric acids, hydrofluoric acid (HF), potassium hydroxide, or the like) or plasma or gas etch techniques. The shallow trenches 1200 may be filled with any suitable dielectric material such as $SiO_2$ or the like.

Figure 3:
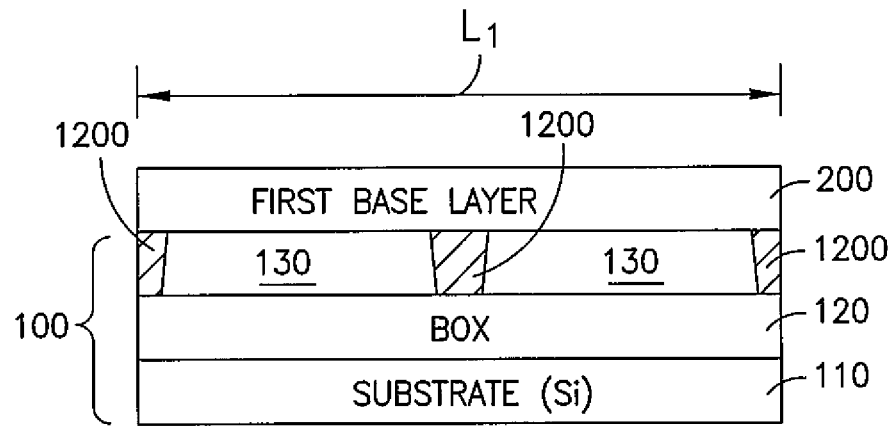
FIG. 3 is a schematic representation of a first base layer disposed on the starting substrate of FIG. 2.

As shown in FIG. 3, a first base layer 200 having a first length $L_1$ is disposed on the intrinsic base semiconductor layer 130 and the shallow trenches 1200 of the starting substrate 100. The first base layer 200 may be disposed on the intrinsic base semiconductor layer 130 using a chemical vapor deposition (CVD) technique or by epitaxial growth. The first base layer 200 may be poly- or single-crystalline silicon. The silicon may be doped to have the same polarity as the intrinsic base layer 130. Suitable N-type dopants include, but are not limited to, arsenic, phosphorus, and antimony. Suitable P-type dopants include, but are not limited to, boron, aluminum, gallium, and indium.

Figure 4:
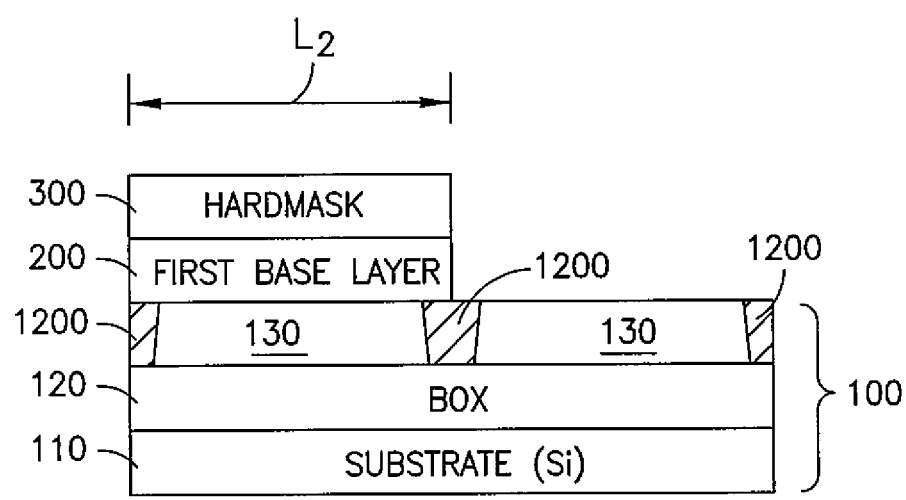
FIG. 4 is a schematic representation of a portion of the first base layer masked and etched.

As shown in FIG. 4, a portion of the first base layer 200 may be masked using a first hardmask 300. The first hardmask 300 may comprise any suitable hardmask material, such as $SiO_2$, a silicon nitride, or the like and may be deposited on the first base layer 200 using CVD, physical vapor deposition (PVD), or a similar technique. Exposed portions of the material of the first base layer 200 (portions not masked by the first hardmask 300) may be etched using any suitable etching process. One exemplary suitable etching process comprises reactive ion etching (RIE), although any other suitable dry etch process may be used. Upon etching, the first base layer 200 is reduced to a second length $L_2$.

Figure 5:
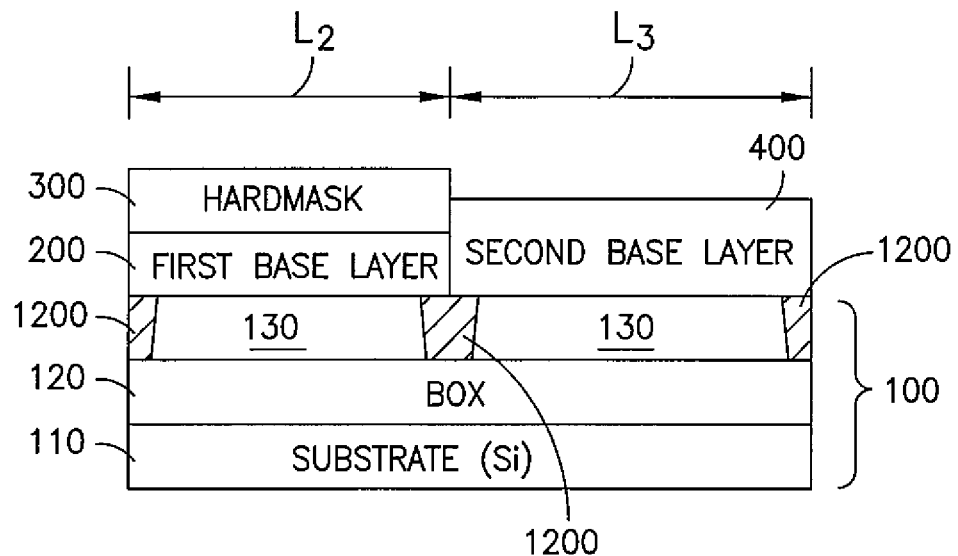
FIG. 5 is a schematic representation of a second base layer disposed on the starting substrate adjacent to the first base layer.

As shown in FIG. 5, a second base layer 400 is disposed on the intrinsic base semiconductor layer 130 adjacent to the first base layer 200. The second base layer 400 may be disposed on the intrinsic base semiconductor layer 130 and the shallow trenches 1200 to have a thickness that is greater than the thickness of the first base layer 200, as shown, or it may be disposed to have a thickness that is less than the thickness of the first base layer 200. The second base layer 400 has a length $L_3$ and may be poly- or single-crystalline SiGe. The length $L_3$ may be more than, less than, or equal to the length $L_2$. The SiGe may be doped to have the same polarity as the intrinsic base layer 130. Suitable N-type dopants include, but are not limited to, arsenic, phosphorus, and antimony. Suitable P-type dopants include, but are not limited to, boron, aluminum, gallium, and indium.

Figure 6:
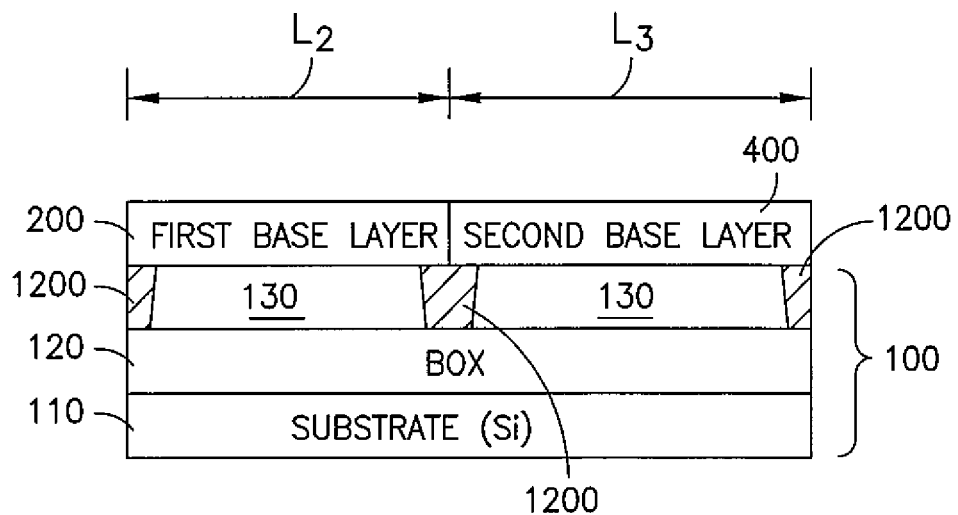
FIG. 6 is a schematic representation of the first and second base layers planarized.

As shown in FIG. 6, the first hardmask 300 on the first base layer 200 is removed. One exemplary means of removing the first hardmask 300 may be via a chemical mechanical polish (CMP) applied to upper surfaces of the first base layer 200 and the adjacent second base layer 400 to planarize the first and second base layers 200, 400. In planarizing, the first base layer 200 and the second base layer 400 are brought to the same thickness.

Figure 7:
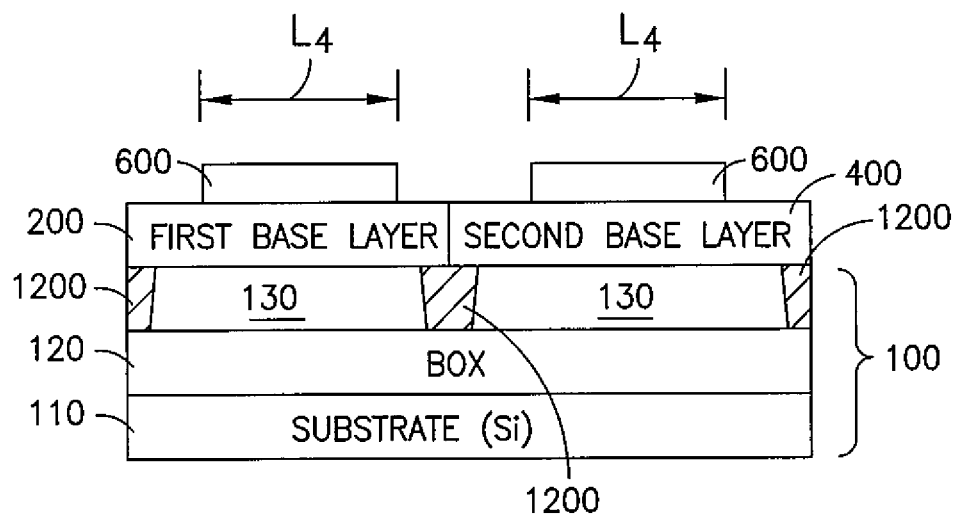
FIG. 7 is a schematic representation of the first and second base layers masked.

As shown in FIG. 7, a second hardmask 600 is deposited on upper surfaces of the first base layer 200 and the second base layer 400. The second hardmask 600 on each of the first base layer 200 and the second base layer 400 is of length $L_4$. The material of the second hardmask 600 may comprise any suitable hardmask material, such as $SiO_2$, a silicon nitride, or the like and may be deposited on the upper surfaces of the first base layer 200 and the second base layer 400 using suitable patterning and CVD, PVD, or a similar technique. Length $L_4$ is less than the spacing between adjacent shallow isolation trenches 1200, such that second hardmask 600 is located above intrinsic base region 130 but not above shallow isolation trenches 1200.

Figure 8:
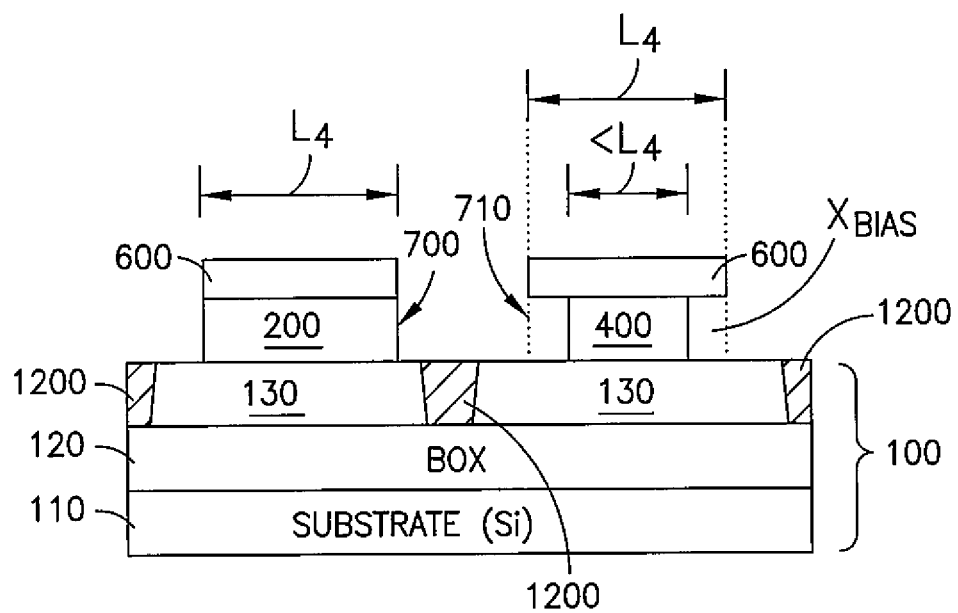
FIG. 8 is a schematic representation of portions of the first and second base layers etched down to the support substrate to form extrinsic base portions.

As shown in FIG. 8, a second RIE process is applied to simultaneously remove exposed portions of the first base layer 200 and the second base layer 400 to form a first extrinsic base 700 and a second extrinsic base 710. Extrinsic base 700 sits atop and is smaller than an intrinsic base semiconductor region 130 bounded by two adjacent shallow trenches 1200, and extrinsic base 710 sits atop and is smaller than another intrinsic base semiconductor region 130 bounded by two adjacent shallow trenches 1200. Each extrinsic base 700, 710 is configured for subsequent connection of the intrinsic base semiconductor layer 130 to a wire or other contact. In using the second RIE process, areas under the second hardmask 600 on the second base layer 400 are selectively undercut due to the second base layer 400 being SiGe and the first base layer 200 being Si such that a length of the second base layer 400 is less than $L_4$, thereby producing an $X_{bias}$ in the second base layer 400 and thereby producing the second extrinsic base 710 as having a reduced cross dimension as compared to the first extrinsic base 700. This selective undercutting of the second base layer 400 is due to the different natures of the Si of the first base layer 200 and the SiGe of the second base layer 400. Accordingly, a smaller cross dimension can be achieved in the extrinsic base 710 of SiGe with the same second RIE process. This process of reducing the cross dimension may be extendable to multiple structures on the intrinsic base semiconductor layer 130 to obtain additional base lengths as desired by using additional base layers of amorphous SiGe with different Ge contents and/or different dopant amounts.

Figure 9:
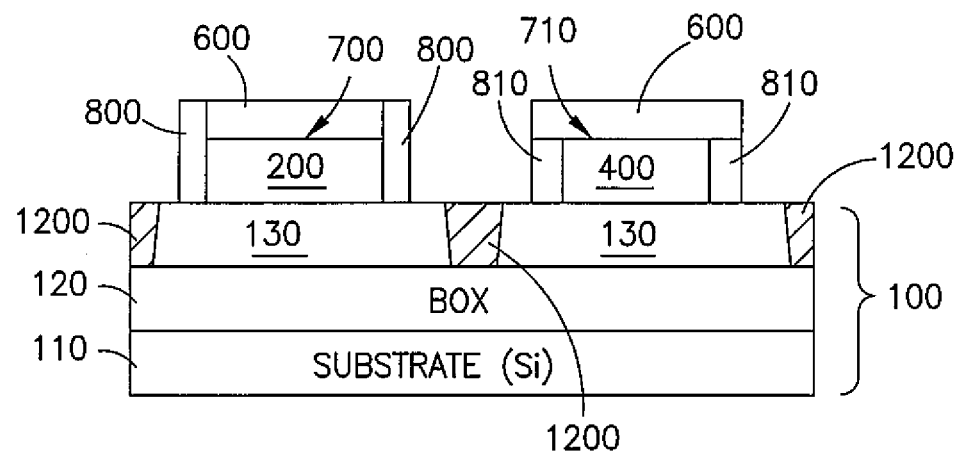
FIG. 9 is a schematic representation of spacers disposed on the extrinsic base portions of FIG. 8.

As shown in FIG. 9, first sidewall spacers 800 are disposed on the first extrinsic base 700, and second sidewall spacers 810 are disposed on the second extrinsic base 710. In disposing the second sidewall spacers 810 on the second extrinsic base 710, the second sidewall spacers 810 are disposed in the $X_{bias}$ (the undercut area). The sidewall spacers 800, 810 are formed by the deposition of dielectric material, such as $SiO_2$, silicon nitride, low-permittivity (low-K) dielectrics such as $SiO_xN_y$, or boron nitride via CVD or low pressure CVD (LPCVD). The sidewall spacers 800, 810 are formed simultaneously on both type of devices by deposition of the dielectric material and RIE.

Figure 10:
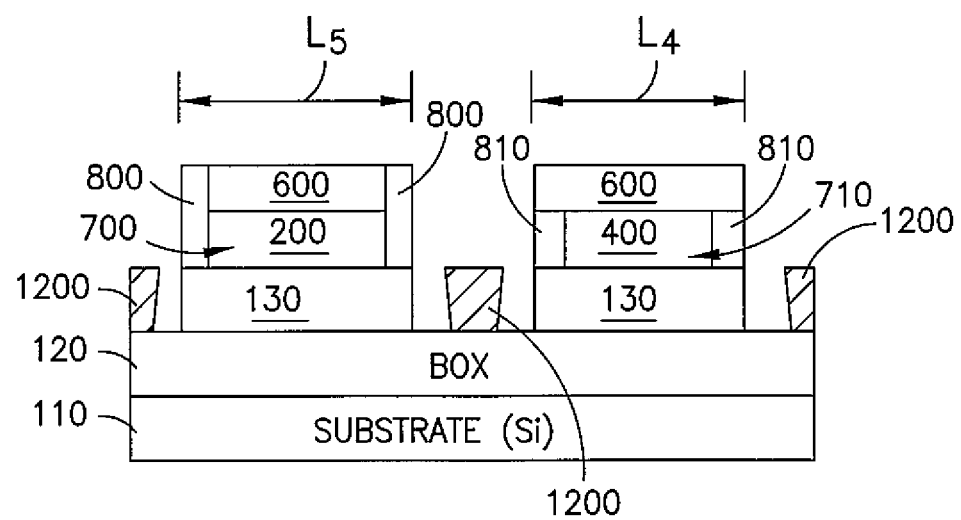
FIG. 10 is a schematic representation of portions of the intrinsic base semiconductor layer of the starting substrate etched to form emitter/collector junctions.

As shown in FIG. 10, a third RIE process is applied to etch the exposed intrinsic base semiconductor layer 130 not protected by hardmask 600 and spacers 800 and 810 down to the $SiO_2$ of the BOX layer 120, thereby leaving material of the intrinsic base semiconductor layer 130 under the spacers 800, 810 and the shallow trenches 1200 in place. A total length of the first extrinsic base 700 with the spacers 800 is $L_5$, and a total length of the second extrinsic base 710 with the spacers 810 remains as $L_4$, with the second base layer 400 having a reduced cross dimension as compared to the first base layer 200.

Figure 11:
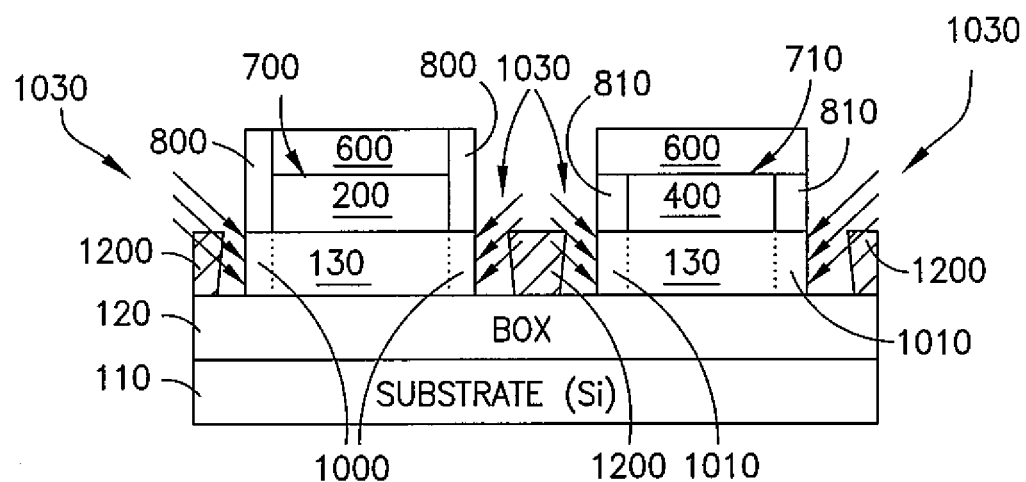
FIG. 11 is a schematic representation of portions of the emitter/collector junctions implanted with ions.

As shown in FIG. 11, a first emitter/collector junction 1000 and a second emitter/collector junction 1010 are formed in the material of the intrinsic base semiconductor layer 130 under the respective first base layer 200 (of the first extrinsic base 700) and second base layer 400 (of the second extrinsic base 710). Each of the emitter/collector junctions 1000, 1010 may be formed by the angled implantation of appropriate ions 1030 into the exposed vertical sides of the intrinsic base semiconductor 130 under the respective first extrinsic base 700 and second extrinsic base 710, followed by an anneal process. Exemplary ions for angled implantation into the exposed vertical sides of the intrinsic base semiconductor 130 include, but are not limited to, phosphorus, arsenic, and antimony for lateral NPN BJT, and boron, aluminum, gallium, and indium for lateral PNP BJT.

Figure 12:
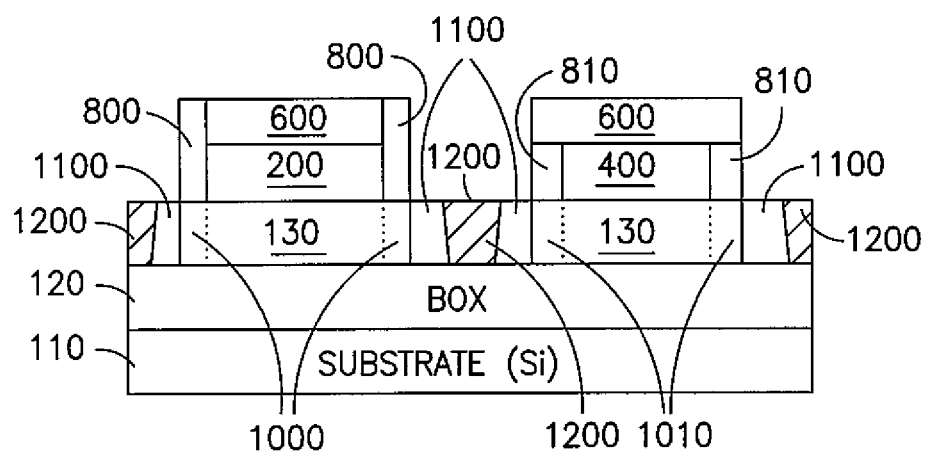
FIG. 12 is a schematic representation of a semiconductor material layer deposited on exposed portions of the starting substrate adjacent to the emitter/collector junctions.

As shown in FIG. 12, a semiconductor material layer 1100 is deposited on the BOX layer 120 adjacent to the first and second emitter/collector junctions 1000, 1010 and adjacent to the shallow trenches 1200. The semiconductor material layer 1100 is deposited up to at least a bottom level of each spacer 800, 810 using, for example, an in-situ epitaxial deposition process. The semiconductor material layer 1100 may be doped with N-type dopants for lateral NPN BJT and with P-type dopants for lateral PNP BJT. Material of the semiconductor material layer 1100 may be silicon or SiGe.

Figure 13:
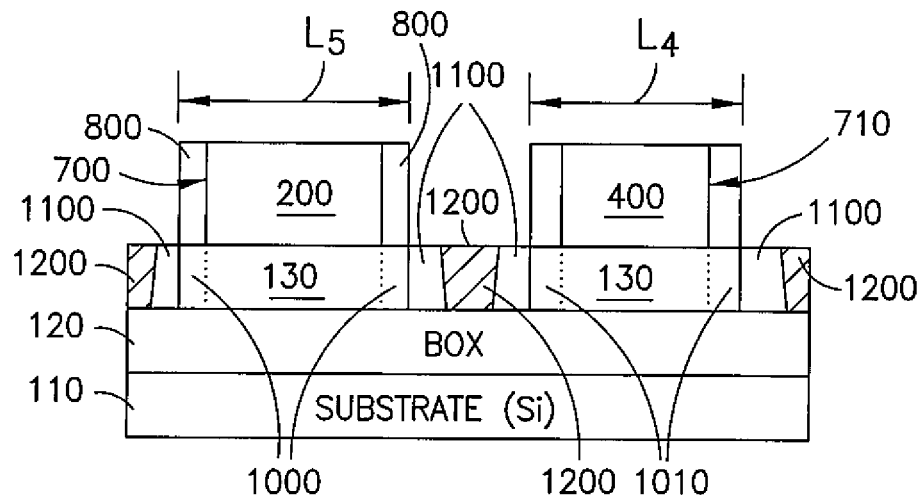
FIG. 13 is a schematic representation of the structure of FIG. 12 planarized to illustrate a first extrinsic base with the first emitter/collector junction and a second extrinsic base with the second emitter/collector junction.

As shown in FIG. 13, the second hardmask 600 and upper portions of the spacers 800 are removed, e.g., using a CMP process to planarize. As can be seen, the resulting structure comprises the first extrinsic base 700 (with spacers 800) with the first emitter/collector junction 1000 to form a first BJT having length $L_5$ and the second extrinsic base 710 with spacers 810 and the second emitter/collector junction 1010 to form a second BJT having length $L_4$ with $L_4$ being less than $L_5$.

Figure 14:
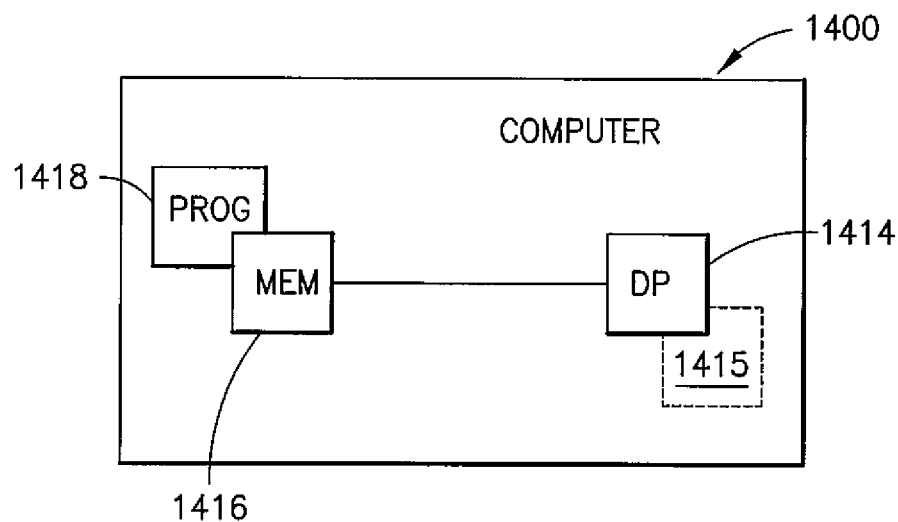
FIG. 14 is a block diagram of various electronic devices and apparatuses that may be suitable for use in forming the exemplary BJT structures described herein.

As shown in FIG. 14, a simplified block diagram of various electronic devices and apparatuses that are suitable for use in practicing the exemplary embodiments described herein is shown. For example, a computer 1400 may be used to control one or more of the fabrication processes (e.g., deposition of hardmask layers 300, 600, formation of trenches 1200, deposition of spacers 800, 810, epitaxial deposition of the semiconductor material layer 1100, and the like) as described above. The computer 1400 includes a data processor (DP) 1414 and a computer-readable memory medium embodied as a memory (MEM) 1416 that stores a program of computer instructions (PROG) 1418.

The PROG 1418 includes program instructions that, when executed by the associated DP 1414, enable the various electronic devices and apparatus to operate in accordance with exemplary embodiments. That is, various exemplary embodiments may be implemented at least in part by computer software executable by the DP 1414, or by hardware, or by a combination of software and hardware (and firmware).

The computer 1400 may also include dedicated processors, for example processor 1415 used for carrying out the exemplary methods for fabricating BJTs of different lengths on a single chip.

The computer readable MEM 1416 may be of any type suitable to the local technical environment and may be implemented using any suitable data storage technology, such as semiconductor based memory devices, flash memory, magnetic memory devices and systems, optical memory devices and systems, fixed memory, and removable memory. The DP 1414 may be of any type suitable to the local technical environment, and may include one or more of general purpose computers, special purpose computers, microprocessors, digital signal processors (DSPs), and processors based on a multicore processor architecture, as non-limiting examples.

The exemplary embodiments, as discussed herein and as particularly described with respect to exemplary methods, may be implemented in conjunction with a program storage device (e.g., at least one memory) readable by a machine, tangibly embodying a program of instructions (e.g., a program or computer program) executable by the machine for performing operations. The operations comprise utilizing the exemplary embodiments of the method.

Figure 15:
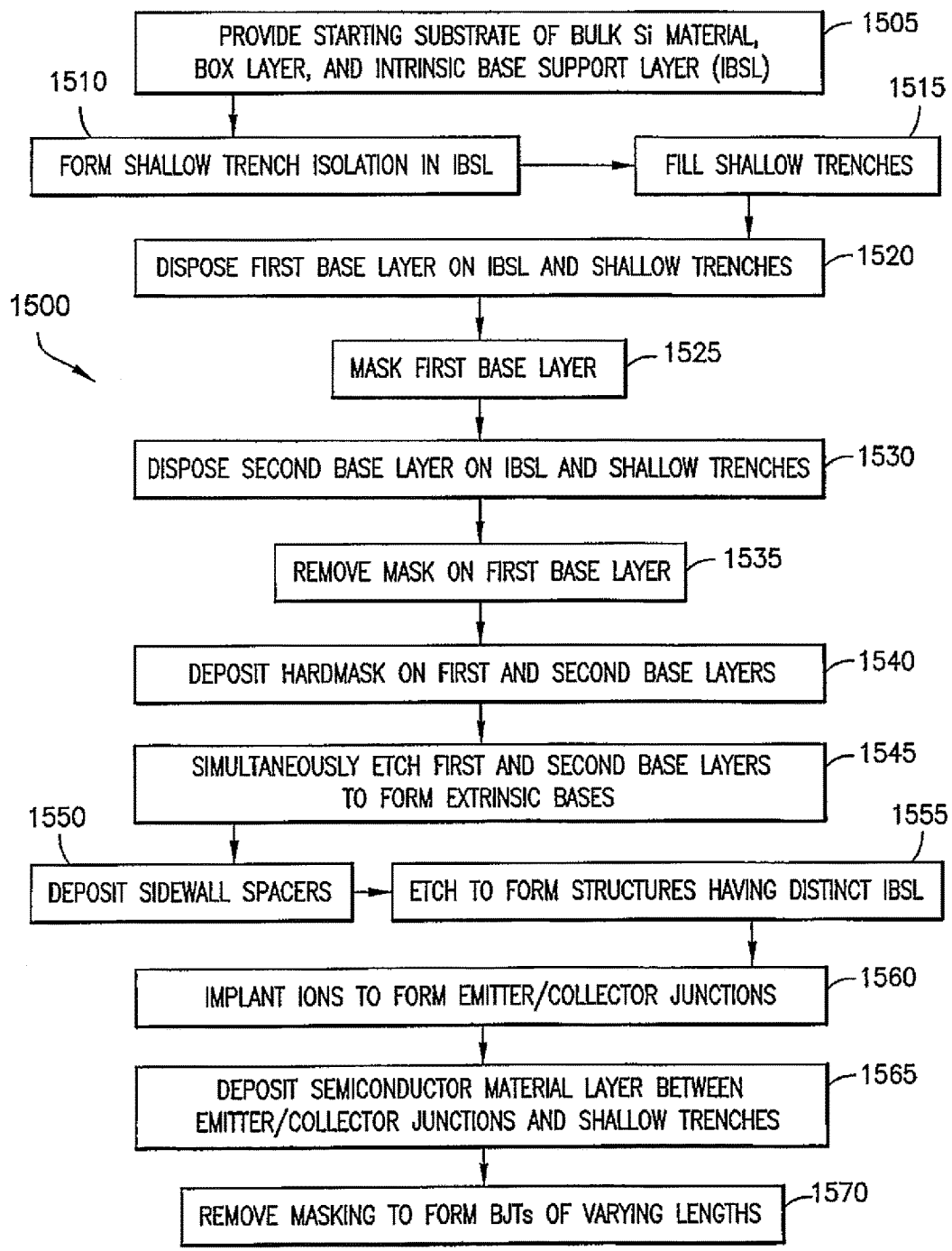
FIG. 15 is a logic flow diagram that illustrates the operation of an exemplary method, and a result of execution of computer program instructions embodied on a computer readable memory, in accordance with an exemplary embodiment of the methods for forming the exemplary BJT structures described herein.

FIG. 15 is a logic flow diagram that illustrates the operation of a method 1500 (and a result of an execution of computer program instructions (such as PROG 1418)), in accordance with the exemplary embodiments. In accordance with these exemplary embodiments, a starting substrate of bulk silicon material, a BOX layer, and an intrinsic base semiconductor layer is provided as shown in block 1505. Shallow trenches are formed in the intrinsic base semiconductor layer, as shown in block 1510. As shown in block 1515, the shallow trenches are filled. As shown in block 1520, a first base layer is disposed on the support layer and the filled shallow trenches. The first base layer is masked, as shown in block 1525, and a second base layer is disposed on the intrinsic base layer and the shallow trenches, as shown in block 1530. The mask on the first base layer is removed, as shown in block 1535. As shown in block 1540, a hardmask is deposited on the first and second base layers. Referring now to block 1545, the first and second base layers are simultaneously etched to form extrinsic bases with the patterning and etching being such that the extrinsic bases have different lengths. As shown in block 1550, sidewall spacers are deposited. As shown in block 1555, an etch process is carried out to form structures having distinct intrinsic base semiconductor layers. Ions are implanted to form emitter/collector junctions, as shown in block 1560. Semiconductor material is deposited between the emitter/collector junctions and the shallow trenches, as shown in block 1565. In block 1570 masking is removed to form BJTs of varying lengths.

The various blocks of method 1500 shown in FIG. 15 may be viewed as method steps, and/or as operations that result from operation of computer program code, and/or as a plurality of coupled logic circuit elements constructed to carry out the associated function(s).

Referring now to all the Figures, in one exemplary embodiment, a method comprises forming shallow trench isolations in an intrinsic base semiconductor layer of a substrate, the substrate comprising the intrinsic base semiconductor layer located on a buried oxide layer, the buried oxide layer being located on a handle substrate; forming a first base layer on the intrinsic base semiconductor layer and the formed shallow trench isolations; applying a first mask to at least a portion of the first base layer; etching an exposed portion of the first base layer not masked; forming a second base layer on the intrinsic base semiconductor layer of the substrate adjacent to the first base layer; removing the applied first mask; applying a second mask to a portion of the first base layer and a portion of the second base layer; simultaneously etching the first base layer and the second base layer, the simultaneous etching causing the material of the second base layer to be undercut around the second mask to produce a first extrinsic base and a second extrinsic base of a reduced cross dimension as compared to the first extrinsic base; disposing sidewall spacers on each of the first extrinsic base and the second extrinsic base; etching the intrinsic base semiconductor layer away around the first extrinsic base and the second extrinsic base leaving the intrinsic base semiconductor layer under the first extrinsic base and the sidewall spacers thereof and under the second extrinsic base and the sidewall spacers thereof; implanting ions into exposed vertical sides of the intrinsic base semiconductor layer under the first extrinsic base to form a first emitter/collector junction and into exposed vertical sides of the intrinsic base semiconductor layer under the second extrinsic base to form a second emitter/collector junction; depositing a layer of semiconductor material on the substrate adjacent to the first emitter/collector junction and the second emitter/collector junction and the formed shallow trenches; and removing the applied second mask.

In the method, simultaneously etching the first base layer and the second base layer may comprise etching using reactive ion etching. Etching the intrinsic base semiconductor layer away around the first extrinsic base and the second extrinsic base leaving the intrinsic base semiconductor layer under the first extrinsic base and the sidewall spacers thereof and under the second extrinsic base and the sidewall spacers thereof may comprise etching the intrinsic base semiconductor layer using reactive ion etching down to the buried oxide layer. The method may further comprise annealing after implanting ions into the exposed vertical sides of intrinsic base semiconductor layer. Depositing a layer of semiconductor material on the substrate adjacent to the first emitter/collector junction and the second emitter/collector junction may comprise epitaxially depositing semiconductor material. Forming shallow trench isolations in the intrinsic base semiconductor layer may comprise etching trenches using an etch technique. Forming shallow trench isolations may further comprise filling the trenches with a dielectric material. Simultaneously etching of the first base layer and the second base layer around the second mask to produce a first extrinsic base and a second extrinsic base may be due to the first base layer being of a different material than the second base layer. A material of the first base layer may comprise poly- or single-crystalline silicon and a material of the second base layer may comprise poly- or single-crystalline SiGe.

In another exemplary embodiment, a method of forming a lateral bipolar junction transistor comprises forming a first base layer of silicon on an intrinsic base semiconductor layer of a substrate; using a shallow trench isolation to isolate portions of the intrinsic base semiconductor layer from other portions of the intrinsic base semiconductor layer; depositing a first hardmask on at least a portion of the first base layer; etching an exposed portion of the first base layer not covered by the first hardmask; forming a second base layer of SiGe on the intrinsic base semiconductor layer of the substrate adjacent to the first base layer; applying a first chemical mechanical polish to remove the first hardmask; patterning upper surfaces of the first base layer and the second base layer by depositing a second hardmask on a portion of the first base layer and a portion of the second base layer; simultaneously etching the first base layer around the second hardmask to produce a first extrinsic base and etching the second base layer around the second hardmask to produce a second extrinsic base; selectively etching the second base layer under the second hardmask to cause the second extrinsic base to have a reduced cross dimension as compared to the first extrinsic base; disposing sidewall spacers on each of the first extrinsic base and the second extrinsic base; etching the intrinsic base semiconductor layer to leave the intrinsic base semiconductor layer under the first extrinsic base and under the second extrinsic base; implanting ions into exposed vertical sides of the intrinsic base semiconductor layer under the first extrinsic base to form a first emitter/collector junction and into exposed vertical sides of the intrinsic base semiconductor layer under the second extrinsic base to form a second emitter/collector junction; annealing the implanted ions; epitaxially depositing a layer of semiconductor material on the substrate adjacent to the first emitter/collector junction and the second emitter/collector junction; and applying a second chemical mechanical polish to remove the second hardmask.

In the method, the first base layer may be formed on the intrinsic base semiconductor layer of the substrate by epitaxial growth or by chemical vapor deposition. The second base layer may be formed on the intrinsic base semiconductor layer of the substrate adjacent to the first base layer by epitaxial growth or by chemical vapor deposition. Applying a first chemical mechanical polish to remove the first hardmask may planarize the upper surfaces of the first base layer and the second base layer. Etching the intrinsic base semiconductor layer to leave the intrinsic base semiconductor layer under the first extrinsic base and under the second extrinsic base may comprise etching the intrinsic base semiconductor layer using reactive ion etching down to a buried oxide layer under the intrinsic base semiconductor layer. Applying a second chemical mechanical polish to remove the second hardmask may comprise planarizing the first base layer and the second base layer.

In another exemplary embodiment, an apparatus comprises a substrate comprising a semiconductor layer of material located on a buried oxide layer, the buried oxide layer being located on a handle substrate; a first emitter/collector disposed in the semiconductor layer of material, a first intrinsic base disposed between a first emitter and a first collector, and a first extrinsic base of a first material disposed on the first intrinsic base; a second emitter/collector disposed in the semiconductor layer of material, a second intrinsic base disposed between a second emitter and a second collector, and a second extrinsic base of a second material disposed on the second intrinsic base; and a shallow trench isolation between the first emitter/collector disposed in the semiconductor layer of material and the second emitter/collector disposed in the semiconductor layer of material. A cross dimension of the first extrinsic base may be different from a cross dimension of the second extrinsic base.

In the apparatus, the first material of the first extrinsic base may comprise poly- or single-crystalline silicon and the second material of the second extrinsic base may comprise poly- or single-crystalline SiGe. The first emitter/collector and the second emitter/collector may each comprise silicon, germanium, or SiGe. The first intrinsic base, the first extrinsic base, the second intrinsic base, and second extrinsic base may have doping of a first conductivity type, and the first emitter/collector and the second emitter/collector may have doping of a second conductivity type, the second conductivity type being opposite first conductivity type.

In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

The invention claimed is:

1. A structure, comprising:
a substrate;
a first lateral bipolar junction transistor disposed on the substrate, the first lateral bipolar junction transistor comprising a first emitter and a first collector, a first intrinsic base between the first emitter and the first collector, and a first extrinsic base directly on an uppermost surface of the first intrinsic base; and
a second lateral bipolar junction transistor disposed on the substrate, the second lateral bipolar junction transistor comprising a second emitter and a second collector, a second intrinsic base between the second emitter and the second collector, and a second extrinsic base directly on an uppermost surface of the second intrinsic base;
wherein a length of the first extrinsic base is different from a length of the second extrinsic base.

2. The structure of claim 1, further comprising an isolation structure between the first lateral bipolar junction transistor and the second lateral bipolar junction transistor.

3. The structure of claim 2, wherein the isolation structure comprises a dielectric material deposited in the substrate.

4. The structure of claim 1, wherein the substrate comprises a layer of semiconductor material, and wherein the first intrinsic base, the first emitter, the first collector, the second intrinsic base, the second emitter, and the second collector are disposed in the layer of semiconductor material.

5. The structure of claim 4, wherein the layer of semiconductor material is disposed on a handle substrate, and wherein a buried oxide layer is disposed between the layer of semiconductor material and the handle substrate.

6. The structure of claim 1, wherein the first extrinsic base comprises poly- or single-crystalline silicon and the second extrinsic base comprises poly- or single-crystalline SiGe.

7. The structure of claim 1, wherein the first intrinsic base, the first extrinsic base, the second intrinsic base, and second extrinsic base have doping of a first conductivity type, and the first emitter and the first collector and the second emitter and the second collector have doping of a second conductivity type, the second conductivity type being opposite first conductivity type.

8. The structure of claim 1, further comprising first sidewall spacers on sides of the first extrinsic base and second sidewall spacers on sides of the second extrinsic base.

9. A semiconductor device, comprising:
a first lateral bipolar junction transistor comprising a first intrinsic base and a first extrinsic base, the first extrinsic base having a first length; and
a second lateral bipolar junction transistor positioned adjacent the first lateral bipolar junction transistor, the second lateral bipolar junction transistor comprising a second intrinsic base and a second extrinsic base, the second extrinsic base having a second length, wherein the second length of the second extrinsic base is different from the first length of the first extrinsic base;
wherein the first extrinsic base is directly on an uppermost surface of the first intrinsic base, and wherein the second extrinsic base is directly on an uppermost surface of the second intrinsic base.

10. The semiconductor device of claim 9, further comprising an isolation structure between the first lateral bipolar junction transistor and the second lateral bipolar junction transistor.

11. The semiconductor device of claim 10, wherein the isolation structure comprises a dielectric material.

12. The semiconductor device of claim 9, further comprising a substrate of semiconductor material on which the first lateral bipolar junction transistor and the second lateral bipolar junction transistor are disposed.

13. The semiconductor device of claim 12, wherein the semiconductor material comprises silicon, germanium, or SiGe.

14. The semiconductor device of claim 9, wherein the first lateral bipolar junction transistor further comprises a first emitter and a first collector adjacent the first intrinsic base, and wherein the second lateral bipolar junction transistor comprises a second emitter and a second collector adjacent the second intrinsic base.

15. The semiconductor device of claim 14, wherein the first extrinsic base and the second extrinsic base have doping of a first conductivity type, and the first emitter and the first collector and the second emitter and the second collector have doping of a second conductivity type, the second conductivity type being opposite first conductivity type.

16. A semiconductor device, comprising:
a substrate comprising a layer of semiconductor material;
a first lateral bipolar junction transistor disposed on the substrate, the first lateral bipolar junction transistor having a first intrinsic base, a first emitter and a first collector disposed in the layer of semiconductor material adjacent the first intrinsic base, and a first extrinsic base disposed directly on an uppermost surface of the first intrinsic base;
a second lateral bipolar junction transistor disposed on the substrate, the second lateral bipolar junction transistor having a second intrinsic base, a second emitter and a second collector disposed in the layer of semiconductor material adjacent the second intrinsic base, and a second extrinsic base disposed directly on an uppermost surface of the second intrinsic base; and
an isolation structure in the layer of semiconductor material between the first intrinsic base and the second intrinsic base;
wherein a length of the first extrinsic base is different from a length of the second extrinsic base.

17. The semiconductor device of claim 16, wherein the first intrinsic base and the second intrinsic base comprise silicon, germanium, or SiGe, wherein the first extrinsic base comprises poly- or single-crystalline silicon, and wherein the second extrinsic base comprises poly- or single-crystalline SiGe.

18. The semiconductor device of claim 16, wherein the first intrinsic base, the first extrinsic base, the second intrinsic base, and second extrinsic base are doped with one or more of arsenic, phosphorous, and antimony, and wherein the first emitter and the first collector and the second emitter and the second collector are doped with one or more of boron, aluminum, gallium, and indium.

19. The semiconductor device of claim 16, wherein the first intrinsic base, the first extrinsic base, the second intrinsic base, and second extrinsic base are doped with one or more of boron, aluminum, gallium, and indium, and wherein the first emitter and the first collector and the second emitter and the second collector are doped with one or more of arsenic, phosphorous, and antimony.

20. The semiconductor device of claim 16, wherein the isolation structure comprises a dielectric material.

* * * * *